(12) United States Patent
Goatley et al.

(10) Patent No.: US 11,146,147 B2
(45) Date of Patent: Oct. 12, 2021

(54) MOTOR POWER PACK WITH OVERMOLDED PRINTED CIRCUIT BOARD INTEGRATED CONNECTOR

(71) Applicant: Dura Operating, LLC, Auburn Hills, MI (US)

(72) Inventors: Michael Goatley, Ortonville, MI (US); Brian Howe, Shelby Township, MI (US)

(73) Assignee: DUS Operating, Inc., Auburn Hills, MI (US)

( * ) Notice: Subject to any disclaimer, the term of this patent is extended or adjusted under 35 U.S.C. 154(b) by 514 days.

(21) Appl. No.: 16/047,709

(22) Filed: Jul. 27, 2018

(65) Prior Publication Data

US 2020/0036265 A1  Jan. 30, 2020

(51) Int. Cl.
| | |
|---|---|
| *H02K 11/33* | (2016.01) |
| *H02K 9/22* | (2006.01) |
| *H02K 11/215* | (2016.01) |
| *H02K 29/08* | (2006.01) |
| *H02K 5/18* | (2006.01) |
| *H05K 1/02* | (2006.01) |
| *H02K 5/08* | (2006.01) |

(52) U.S. Cl.
CPC ............. *H02K 9/22* (2013.01); *H02K 5/08* (2013.01); *H02K 5/18* (2013.01); *H02K 11/215* (2016.01); *H02K 11/33* (2016.01); *H02K 29/08* (2013.01); *H05K 1/0203* (2013.01); *H05K 2201/066* (2013.01); *H05K 2201/10151* (2013.01)

(58) Field of Classification Search
CPC ...... H02K 11/215; H02K 11/33; H02K 29/08; H02K 5/08; H02K 5/18; H02K 9/22; H05K 1/02
See application file for complete search history.

(56) References Cited

U.S. PATENT DOCUMENTS

| | | |
|---|---|---|
| 5,155,579 A | 10/1992 | Auyeung |
| 5,327,064 A | 7/1994 | Arakawa et al. |
| 7,518,273 B2 * | 4/2009 | Kataoka ............. H02K 29/08 310/68 B |

(Continued)

FOREIGN PATENT DOCUMENTS

| | | | |
|---|---|---|---|
| EP | 2256908 B1 | 4/2018 | |
| JP | 2017189731 A | * 9/2017 | ............. H02K 11/33 |

*Primary Examiner* — Tran N Nguyen
*Assistant Examiner* — Leda T Pham
(74) *Attorney, Agent, or Firm* — Vivacqua Crane

(57) ABSTRACT

A motor electronics unit includes a printed circuit board having a first and a second side. An electrical conductor is connected to the printed circuit board. A heat sink is positioned proximate to the printed circuit board. A housing of a polymeric material includes: an endcap encapsulating the printed circuit board and covering an outer edge of the heat sink defining a heat sink first portion, with a second portion of the heat sink not covered by the polymeric material and extending through and outward from the endcap to transfer heat from the printed circuit board. A first section of the electrical conductor extends through and is partially encapsulated by the endcap. A connector body is integrally connected to the housing. A second section of the electrical conductor is exposed within a cavity of the connector body to electrically connect the printed circuit board to another component.

13 Claims, 7 Drawing Sheets

(56) References Cited

U.S. PATENT DOCUMENTS

| | | |
|---|---|---|
| 7,629,716 B2 | 12/2009 | Neal |
| 10,541,588 B2 * | 1/2020 | Wachter .................. H02K 5/225 |
| 10,694,633 B2 * | 6/2020 | Eddison .................. H02K 11/33 |
| 2003/0034557 A1 | 2/2003 | Gupta et al. |
| 2006/0164811 A1 | 7/2006 | Maxwell et al. |
| 2012/0031215 A1 | 2/2012 | Feier |
| 2013/0058044 A1 * | 3/2013 | Watanabe .......... H05K 7/20854 |
| | | 361/714 |
| 2015/0333603 A1 | 11/2015 | von Willich et al. |
| 2016/0099627 A1 * | 4/2016 | Johnson .................. H02K 15/12 |
| | | 310/68 D |
| 2018/0083510 A1 | 3/2018 | Purohit et al. |
| 2019/0103788 A1 * | 4/2019 | Iwasaki .................. H02K 11/27 |

* cited by examiner

… (1) …

MOTOR POWER PACK WITH OVERMOLDED PRINTED CIRCUIT BOARD INTEGRATED CONNECTOR

FIELD

The present disclosure relates generally to electrical components including electrical motors used in motor vehicles.

BACKGROUND

The statements in this section merely provide background information related to the present disclosure and may or may not constitute prior art.

ISO 26262, titled "Road vehicles—Functional safety", is an international standard defining functional safety requirements of electrical and electronic systems in production automobiles defined by the International Organization for Standardization (ISO). To meet the requirements of ISO 26262, electrical and electronic components such as motors and electrical systems must meet redundancy and functionality requirements after failure. Presently, a failure mode for which no redundancy and functionality after failure are provided occurs for electrical components such as motors and motor power packs when subjected to water impingement, and particularly when immersed in water.

The electrical components of a motor or actuator such as for power steering systems, transmission actuators and the like, including the motor, conductors and sensors, are normally enclosed within an air-filled cavity of a housing. The cavity is sealed to atmosphere using a sealing member such as a gasket. Such heat generating components are particularly susceptible to moisture entrance and subsequent failure when a hot component is immersed or splashed with water, which rapidly cools the component housing, allowing contraction of a portion of the sealed housing causing distortion of the gasket sealing area and therefore for moisture to enter past a sealing member such as a gasket.

Thus, while current automobile vehicle electrical and electronic systems achieve their intended purpose, there is a need for a new and improved system and method for sealing electrical components such as motor power packs with housings.

SUMMARY

According to several aspects, a motor electronics unit includes a printed circuit board having a first side and a second side. At least one electrical conductor is connected to the printed circuit board. A heat sink is positioned proximate to the printed circuit board. A housing molded from a low pressure injection molded thermally conductive polymeric material includes: an endcap encapsulating the printed circuit board and covering an outer edge of the heat sink defining a first portion of the heat sink, with a second portion of the heat sink functioning to transfer heat from the printed circuit board. A first section of the at least one electrical conductor extends through and is partially encapsulated by the endcap.

In another aspect of the present disclosure, a connector body integrally is connected to the housing. A second section of the at least one electrical conductor is exposed within a cavity of the connector body and configured to electrically connect the printed circuit board to another component.

In another aspect of the present disclosure, the connector body extends outwardly from an end surface of the endcap.

In another aspect of the present disclosure, the connector body extends outward and away from the heat sink and in a direction perpendicular to the printed circuit board.

In another aspect of the present disclosure, the connector body defines a connector shroud encircling the second section of the at least one electrical conductor for attachment to an electrical connector.

In another aspect of the present disclosure, the at least one electrical conductor defines first and second input electrical power conductors functioning to supply power to the printed circuit board.

In another aspect of the present disclosure, the at least one electrical conductor defines multiple pins functioning to transmit communication signals.

In another aspect of the present disclosure, a sensor positioned on the second side of the printed circuit board for sensing a position of a motor shaft.

In another aspect of the present disclosure, the sensor is a Hall Effect sensor having a portion of the sensor exposed, and not overmolded by the polymeric material of the housing or the endcap.

In another aspect of the present disclosure, the housing includes a recess for receiving a portion of a motor shaft, with the sensor positioned proximal to the recess.

In another aspect of the present disclosure, the heat sink includes multiple raised ribs extending outward from the end surface of the endcap.

In another aspect of the present disclosure, the first side of the printed circuit board contains multiple field effect transistors positioned in a predetermined area, each electrically connected to output conductors of a motor stator that extend from the housing, wherein the heat sink is positioned above the predetermined area.

In another aspect of the present disclosure, the field effect transistors are spaced from the heat sink to define a gap, the gap being filled with overmolded polymeric material of the housing or other thermally conductive material.

In another aspect of the present disclosure, the at least one electrical conductor defines multiple output conductors extending away from the second side of the printed circuit board, wherein the output conductors are spaced from an inner surface of the housing and do not extend beyond a mating surface of a mounting flange of the housing adapted to mate the housing to a motor.

In another aspect of the present disclosure, the second portion of the heat sink is not covered by the polymeric material and extends through and outward from the endcap.

According to several aspects, a motor electronics unit includes a printed circuit board having a first side and a second side and having electronic components connected to the printed circuit board. At least one electrical conductor is connected to the printed circuit board. A heat sink is connected to the printed circuit board. A housing has an endcap both co-molded in a low pressure injection molding process of a thermally conductive polymeric material, wherein: the endcap encapsulates the printed circuit board including the electronic components connected to the printed circuit board and covers a first portion of the heat sink, with a second portion of the heat sink uncovered by the polymeric material of the endcap and adapted for transferring heat away from the printed circuit board. The endcap encapsulates a first section of the at least one electrical conductor.

In another aspect of the present disclosure, the at least one electrical conductor defines: first and second input electrical power conductors functioning to supply power to the printed circuit board; multiple first pins functioning to transmit communication signals; and multiple second pins functioning to transmit sensor signals.

In another aspect of the present disclosure, the endcap includes: a connector body integrally connected to the endcap, a second section of the at least one electrical conductor exposed within a cavity of the connector body and configured to electrically connect the printed circuit board to another component; and the connector body extends outward and away from the heat sink and in a direction perpendicular to the printed circuit board.

In another aspect of the present disclosure, the first side of the printed circuit board contains multiple field effect transistors positioned in a predetermined area, each electrically connected to output conductors of a motor stator that extend from the housing, wherein the heat sink is positioned above the predetermined area; and the field effect transistors are spaced from the heat sink to define a gap, the gap being filled with the polymeric material of the housing.

According to several aspects, a motor electronics unit includes a printed circuit board having a first side and a second side. At least one electrical conductor is connected to the printed circuit board. A heat sink is positioned proximate to the printed circuit board. A housing is molded from a low pressure injection molded thermally conductive polymeric material. The housing includes: an endcap encapsulating the printed circuit board and covering an outer edge of the heat sink defining a first portion of the heat sink, with a second portion of the heat sink not covered by the polymeric material and extending through and outward from the endcap and functioning to transfer heat from the printed circuit board, with a first section of the at least one electrical conductor extending through and partially encapsulated by the endcap; and a connector body integrally connected to the housing, a second section of the at least one electrical conductor exposed within a cavity of the connector body and configured to electrically connect the printed circuit board to another component.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Figure 1:
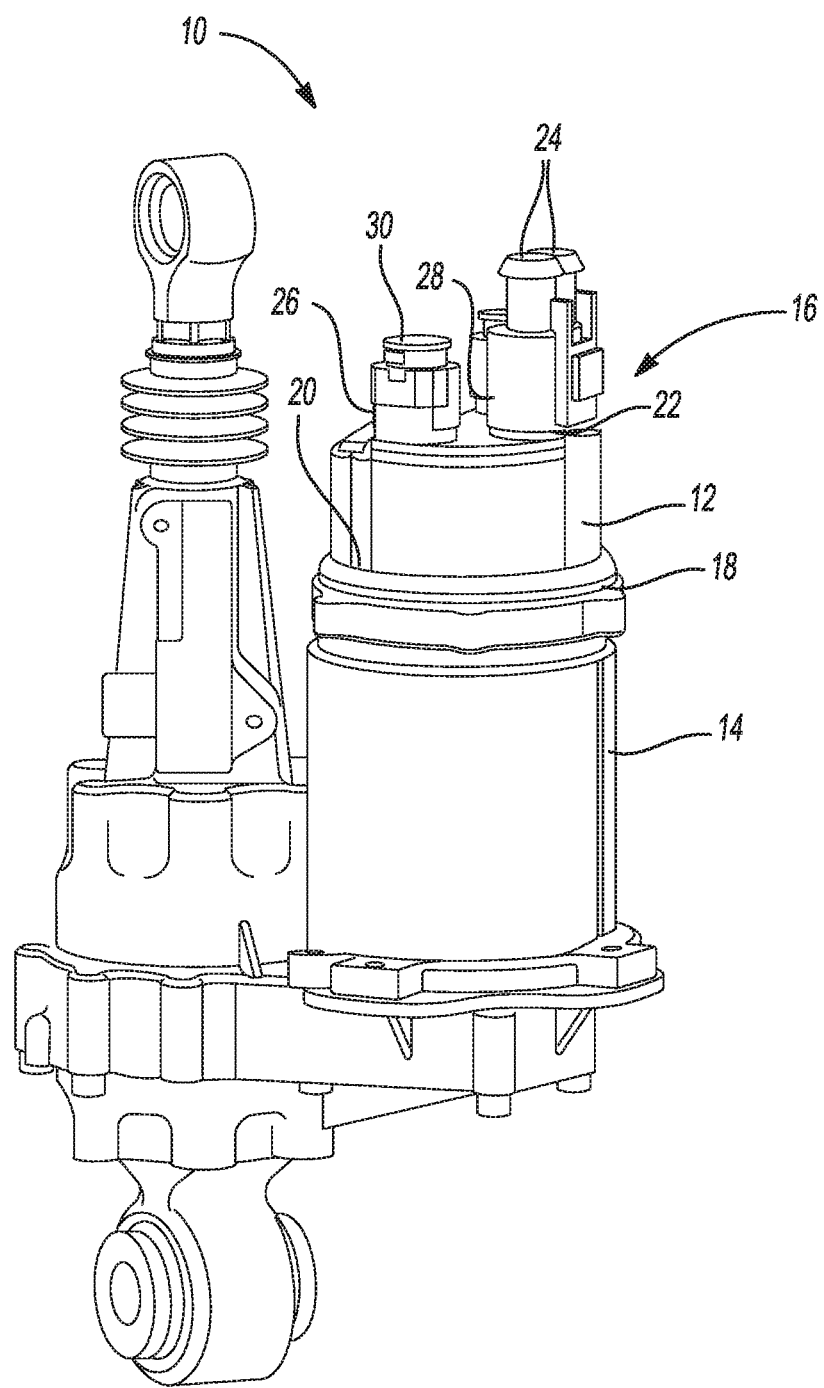
FIG. 1 is a front elevational perspective view of a steering system actuator having a motor and actuator assembly according to an exemplary embodiment.

Referring to FIG. 1, an exemplary motor and actuator assembly 10 includes a motor electronics unit 12 of the present disclosure having an overmolded printed circuit board and an integrated connector described in greater detail below. As used herein, "overmold" or "overmolded" is defined as an injection or a low pressure molding process where one material, typically a thermoplastic material is molded onto a second material, typically a rigid polymeric material such as a printed circuit board, the electronic components mounted to the printed circuit board, or a metal component such as an electrical conductor. The motor electronics unit 12 is attached to an electric motor 14 to create for example a motor vehicle steering actuator assembly 16. The motor electronics unit 12 can also be used in conjunction with other types of electric motors, and can be used in multiple motor or actuator assemblies.

In the exemplary embodiment, the motor electronics unit 12 is mounted to a flange 18 of the motor 14 using multiple fasteners 20. The motor electronics unit 12 includes multiple electrical connector bodies such as a power connector body 22 adapted to provide connectivity to motor power connectors 24. The electrical connector bodies further include a communication pin connector body 26 and an external sensor pin connector body 28. Adapters such as an external sensor pin adapter 30 can be connected to the external sensor pin connector 28. According to several aspects, each of the connector bodies defines a connector shroud positioned around a conductor described in reference to FIG. 3 for attachment to an electrical connector.

Referring to FIG. 2 and again to FIG. 1, according to several aspects the motor electronics unit 12 includes a cylindrical-shaped housing 32 having an integral mounting flange 34 to mate with the motor 14. Although an exemplary cylindrical-shape is shown for the housing 32, the housing 32 can have any desired geometric shape. The mounting flange 34 includes multiple apertures 36 which individually receive one of the fasteners 20. A heat sink 38 is fixed to the motor electronics unit 12 during an injection molding operation and partially extends outward of the housing 32 of the motor electronics unit 12 defining a sealed perimeter 40 where a polymeric material of the motor electronics unit 12 bonds to the heat sink 38 defining an adhesion bond 42.

Figure 2:
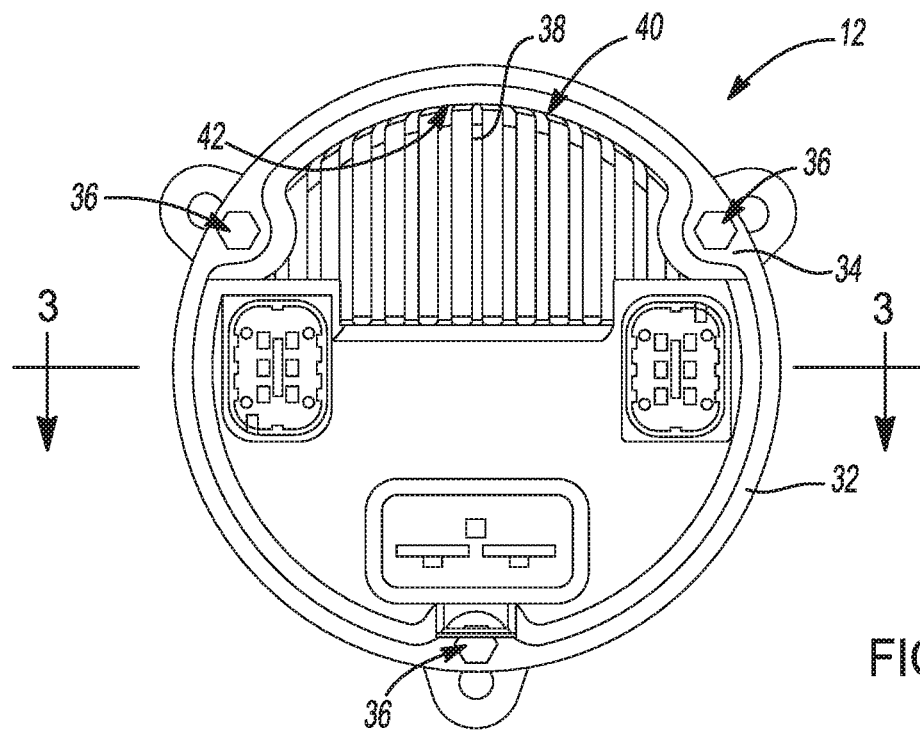
FIG. 2 is a top plan view of the motor and actuator assembly of FIG. 1.

Referring to FIG. 3 and again to FIGS. 1 through 2, according to several aspects, each of the power connector body 22, the communication pin connector body 26 and the external sensor pin connector body 28 are formed of the same polymeric material as the housing 32 during an injection molding procedure to form the housing 32, and are therefore homogeneous, integrally connected extensions of the housing 32, extending upwardly as viewed in FIG. 3 away from an upper surface 44 of the housing 32. In order for the components contained within the housing 32 to be protected against moisture entrance, the polymeric material which forms and fills the housing 32 must have a similar or identical coefficient of thermal expansion as the polymeric materials within the housing 32. According to several aspects, the polymeric material of the housing 32 defines a thermoset, inorganic filled epoxy molding compound material, such as Epoxidur® EP 3581 X, available from Raschig GmbH of Ludwigshafen, Germany. The power connector body 22 includes a bore 46 which has input electrical power conductors 48, 50 positioned within the bore 46. Similarly, the communication pin connector body 26 includes a bore 52 which has multiple communication pins 54 freely extending into the bore 52, and the external sensor pin connector body 28 includes a bore 55 which has multiple external sensor pins 56 freely extending into the bore 55.

A printed circuit board 58 is completely overmolded with the polymeric material of the housing 32 during injection molding of the housing 32 such that the printed circuit board 58 is fixed within a substantially solid inner body 60 of the housing 32. Each of the communication pins 54 and the external sensor pins 56 are mounted to the printed circuit board 58 prior to positioning the printed circuit board 58 in a mold (not shown) of an injection molding machine (not shown). Portions of the communication pins 54 and the external sensor pins 56 that do not freely extend into either the bore 52 or the bore 55 are therefore also partially overmolded and fixed within the solid inner body 60 of the housing 32.

A portion of the solid inner body 60 of the housing 32 is omitted to create a motor cavity 62 at the time of injection molding and is sized to slidably receive an end portion including a motor shaft of the motor 14. The solid inner body 60 prevents any moisture which may enter the motor cavity 62 from directly contacting the printed circuit board 58 and any components mounted on the printed circuit board 58 (discussed in reference to FIGS. 4-8) or from directly contacting the communication pins 54 and the external sensor pins 56. According to several aspects, each of the connector bodies including the power connector body 22, the communication pin connector body 26 and the external sensor pin connector body 28 extend outward and away from the heat sink 38 and in a direction perpendicular to the printed circuit board 58.

Figure 3:
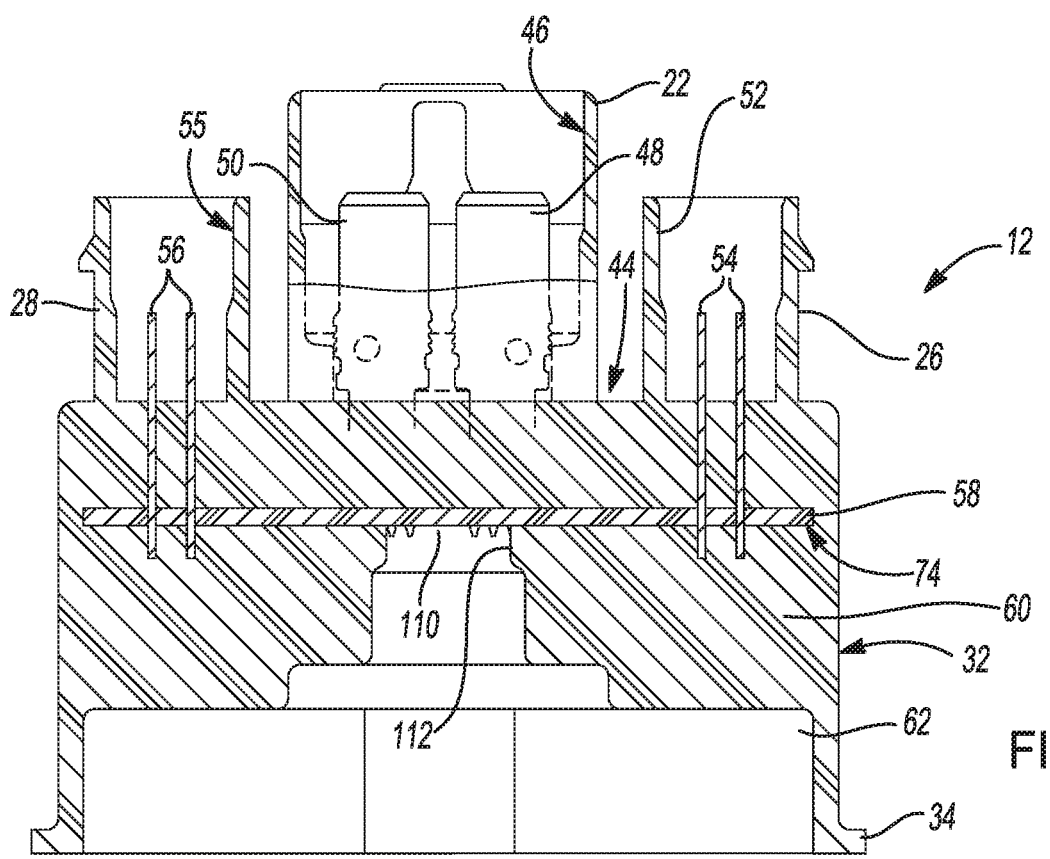
FIG. 3 is a front elevational cross sectional view taken at section 3 of FIG. 2.

Referring to FIG. 4 and again to FIG. 3, a first side or top surface 64 of the printed circuit board 58 includes several "keepout" areas 66 or zones which are retained free of electronic components. In addition, multiple press-fit areas 68 are retained for installation of friction or compliant-fit electrical pins such as the communication pins 54 and the external sensor pins 56 which may be friction fit or may be soldered connections to the printed circuit board 58. The first side or top surface 64 of the printed circuit board 58 provides multiple field effect transistors 70 positioned in a predetermined area 71, each electrically connected to the output conductors 80, 80', 80" described in reference to FIG. 8 of a motor stator of the motor 14 that extend from the housing 32, and the heat sink 38 is positioned above the predetermined area 71. The field effect transistors 70 are also spaced from the heat sink 38 to define a portion of the predetermined spacing 82 also described in reference to FIG. 8, the predetermined spacing 82 being filled with the over-mold polymeric material of the housing 32 or other thermally conductive material. An integrated circuit installation area 72 is also reserved.

Figure 4:
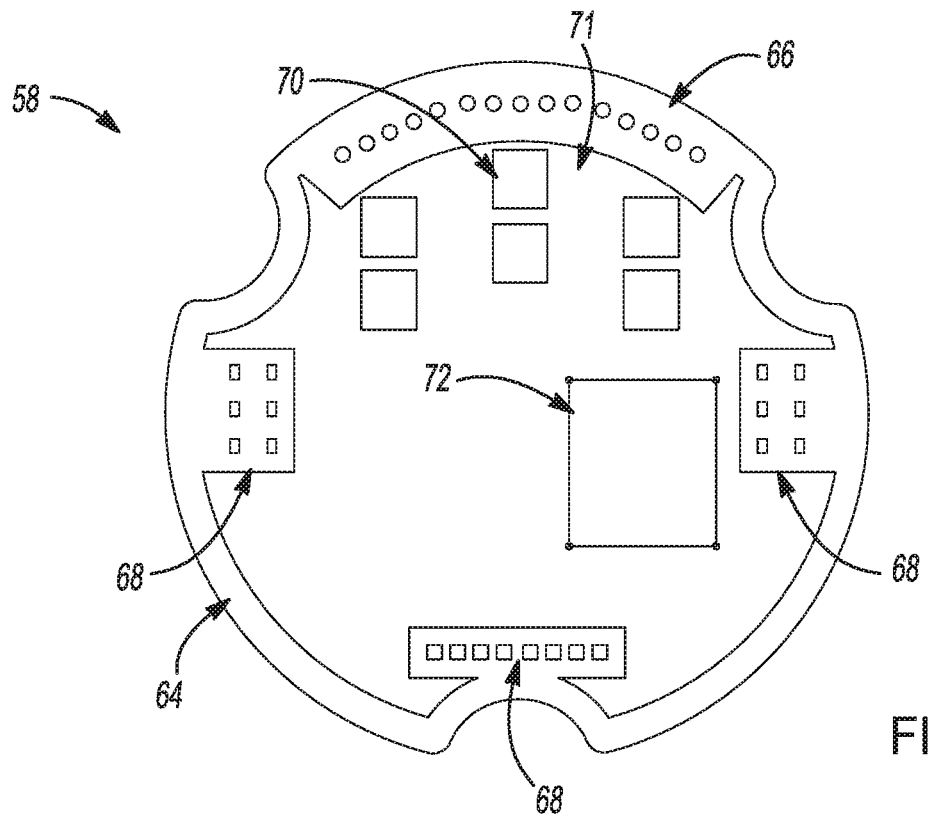
FIG. 4 is a top plan view of a printed circuit board of the motor and actuator assembly of FIG. 1.

Referring to FIG. 5 and again to FIG. 4, a second side or bottom surface 74 of the printed circuit board 58 includes multiple field effect transistor heatsink contact areas 76 corresponding to heat transfer zones of the field effect transistors 70 on the top surface 64. In addition, multiple electromagnetic compatibility capacitor installation areas 78 are reserved.

Referring to FIG. 6 and again to FIG. 4, the input electrical power conductors 48, 50 are positioned on the top surface 64 of the printed circuit board 58 and fixed to the printed circuit board 58 for example by soldering into apertures created in the printed circuit board 58. Each of the communication pins 54 and the external sensor pins 56 are mounted to the printed circuit board 58 by frictional contact as each is pressed into an aperture created in the printed circuit board.

Figure 5:
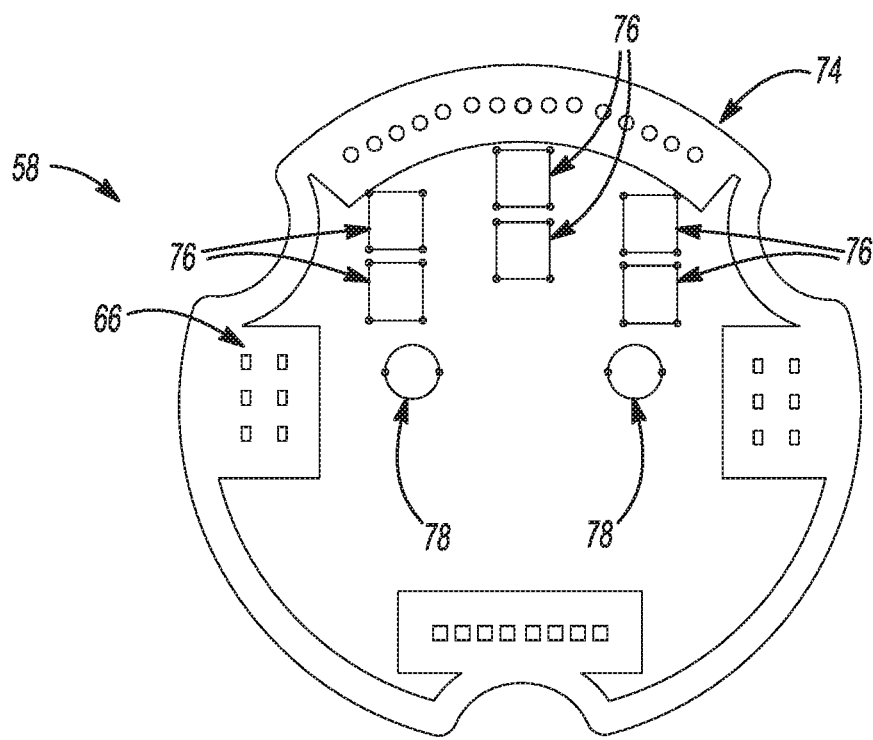
FIG. 5 is a bottom plan view of the printed circuit board of FIG. 4.
Figure 6:
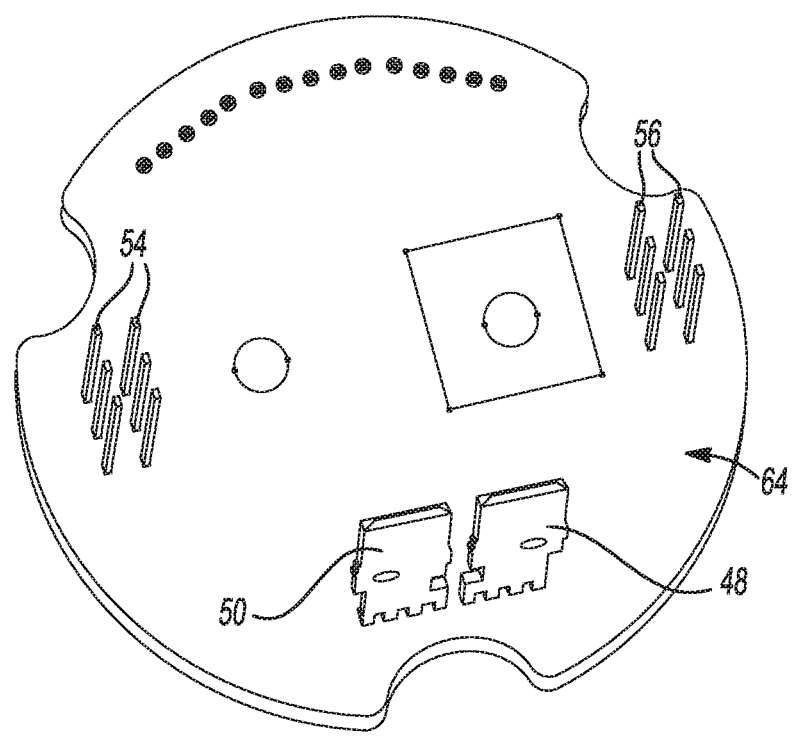
FIG. 6 is a top plan view of the printed circuit board of FIG. 4 further including electronic connectors.
Figure 7:
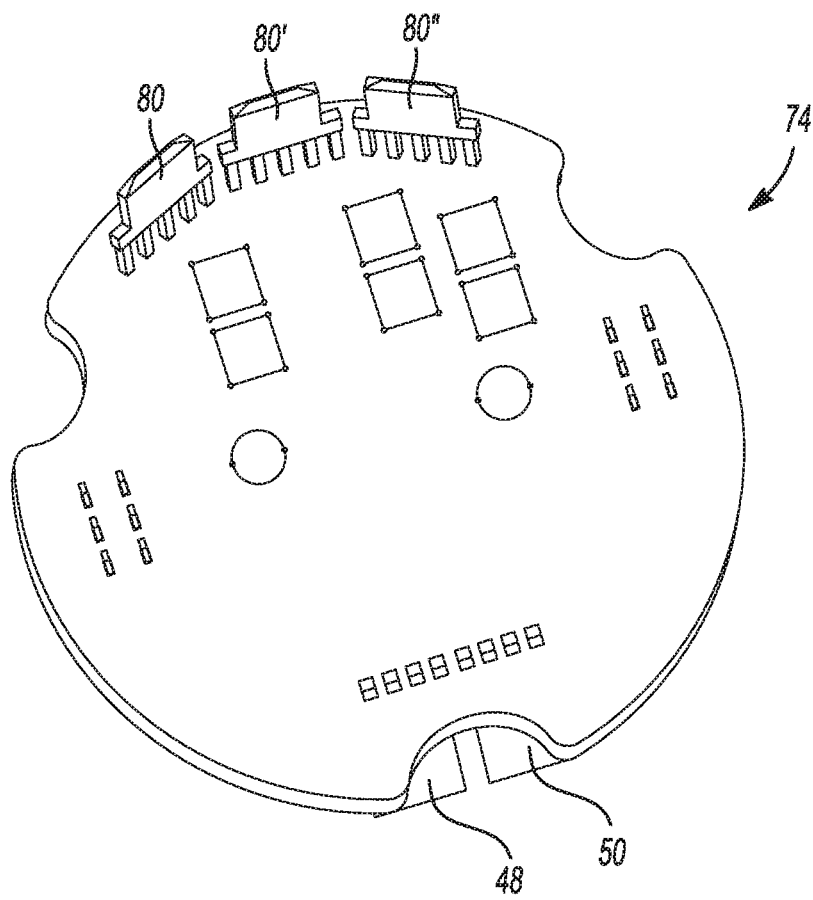
FIG. 7 is a bottom plan view of the printed circuit board of FIG. 5 further including electronic connectors.
Figure 8:
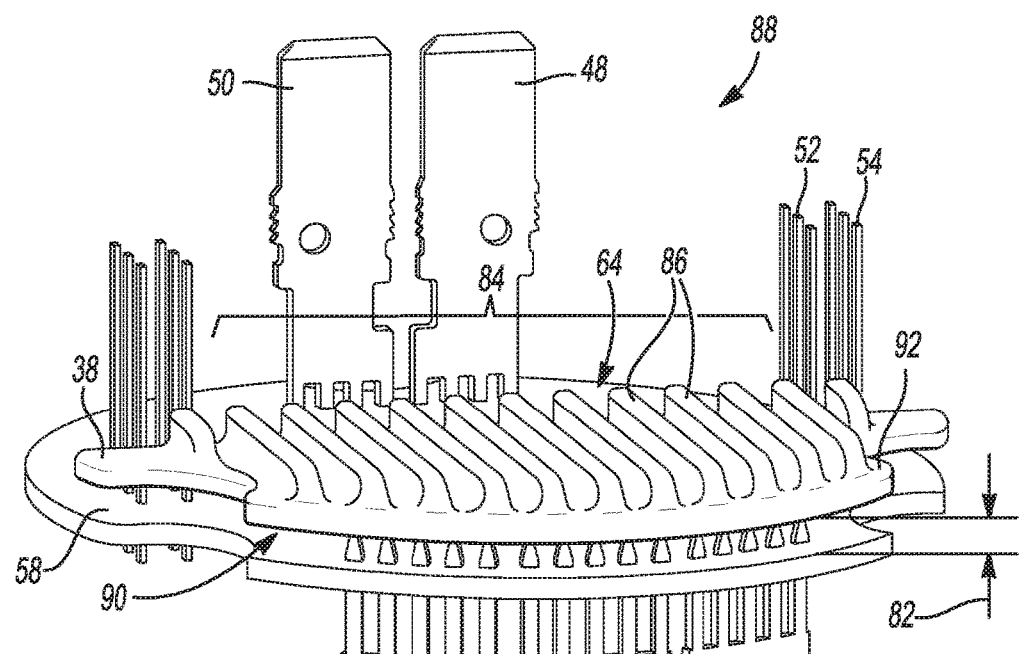
FIG. 8 is a front perspective view of a printed circuit board assembly of the motor and actuator assembly of FIG. 1.

Referring to FIG. 7 and again to FIG. 5, each of three motor electrical output conductors 80, 80', 80" are positioned on the bottom surface 74 of the printed circuit board 58. The three motor electrical output conductors 80, 80', 80" are fixed to the printed circuit board 58 for example by soldering into apertures created in one of the keepout areas 66 of the printed circuit board 58.

Referring to FIG. 8 and again to FIGS. 3 through 7, the heat sink 38 is positioned proximate to the top surface 64 of the printed circuit board 58 and retained at a predetermined spacing 82 away from the top surface 64. An exposed portion 84 of the heat sink 38 provides multiple raised ribs 86 facing away from the top surface 64. With the components including the heat sink 38 in position as shown, a printed circuit board assembly 88 is created which is placed in a die (not shown) of an injection molding machine and the polymeric material of the housing 32 of the motor electronics unit 12, typically in pellet form, is pre-heated to a melting point and fed into an injection barrel for injection into the mold.

The predetermined spacing 82 defines a gap between a printed circuit board facing surface 90 of the heat sink 38 and the top surface 64 of the printed circuit board 58 that allows the liquefied polymeric material to flow entirely through the gap between the heat sink 38 and the top surface 64 of the printed circuit board 58 and partially about an outer perimeter or edge 92 of the heat sink 38 during the injection molding step. Therefore the printed circuit board facing surface 90 and the outer perimeter or edge 92 of the heat sink 38 are at least partially overmolded with polymeric material to fix the heat sink 38 in the position shown. The polymeric material of the housing 32 which flows into the predetermined spacing 82 provides of a more efficient heat transfer path between heat producing components on the printed circuit board 58 and the external environment than provided by air in the same gap. At this time the printed circuit board assembly 88, except for the exposed portion 84 of the heat sink 38 having the raised ribs 86 is also overmolded with the polymeric material which creates the substantially solid inner body 60 of the housing 32.

Figure 9:
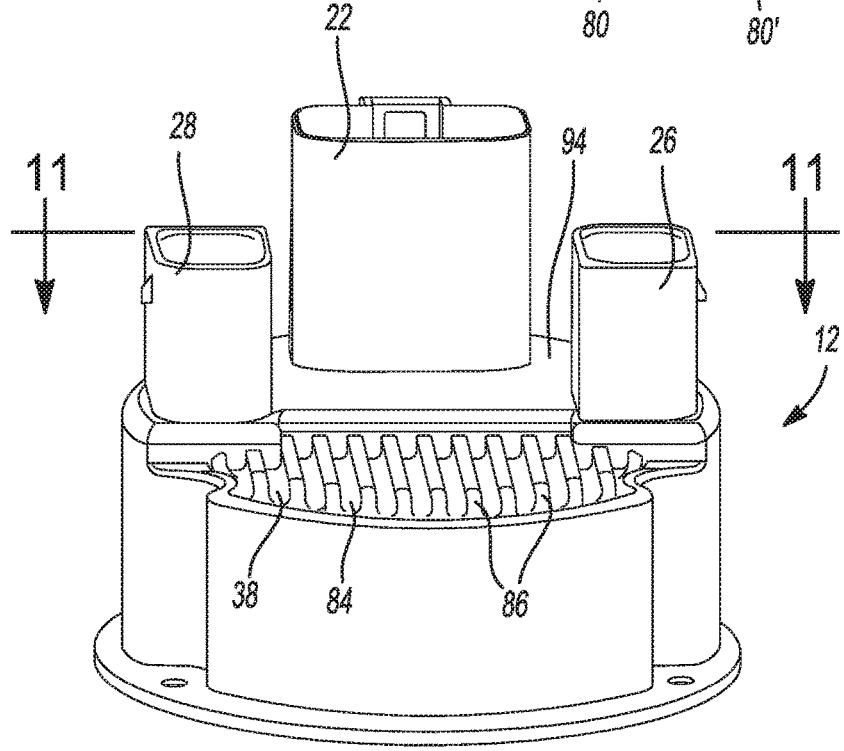
FIG. 9 is a front perspective view of a motor electronics unit of the present disclosure.

Referring to FIG. 9 and again to FIGS. 3 through 8, a completed motor electronics unit 12 is removed from the mold after a cooling period of approximately 90 seconds. The exposed portion of the heat sink 38 having the raised ribs 86 extends outwardly of an endcap 94 of the motor electronics unit 12 also co-molded at the same time and of the same polymeric material as the housing 32. The exposed portion 84 of the heat sink 38 is therefore exposed to atmosphere to permit heat transfer from the electronics components mounted on the printed circuit board, now overmolded by the substantially solid inner body 60 of the housing 32 to atmosphere.

Referring to FIG. 10 and again to FIGS. 1 through 8, the completed motor electronics unit 12 is mounted to the motor 14 as follows. Three cross contacts 96 are individually fixed to one of each of three motor terminals 98. A gasket 100 is placed within a gasket slot 102 created in a motor mounting flange 104 of the motor 14. Each of the three motor electrical output conductors 80, 80', 80" are aligned with and frictionally engaged in one of the three cross contacts 96 until the mounting flange 34 of the motor electronics unit 12 seats on the motor mounting flange 104 of the motor 14, thereby compressing the gasket 100. The fasteners 20 are then threadingly engaged through the mounting flange 34 to the motor mounting flange 104 to retain the motor electronics unit 12. A motor shaft 106 of the motor 14 includes a magnet 108 used for sending motor operation.

With continuing reference to FIG. 10 and again to FIG. 3, a sensor 110 is positioned on the second side 74 of the printed circuit board 58 for sensing a position of the motor shaft 106. According to several aspects, the sensor 110 is a Hall Effect sensor having a portion of the sensor 110 exposed, defined as not overmolded with the material of the substantially solid inner body 60 of the housing 32. The substantially solid inner body 60 of the housing 32 includes a recess 112 extending from the motor cavity 62 for receiving a portion of the motor shaft 106, with the sensor 110 positioned proximal to the recess 112.

Figure 10:
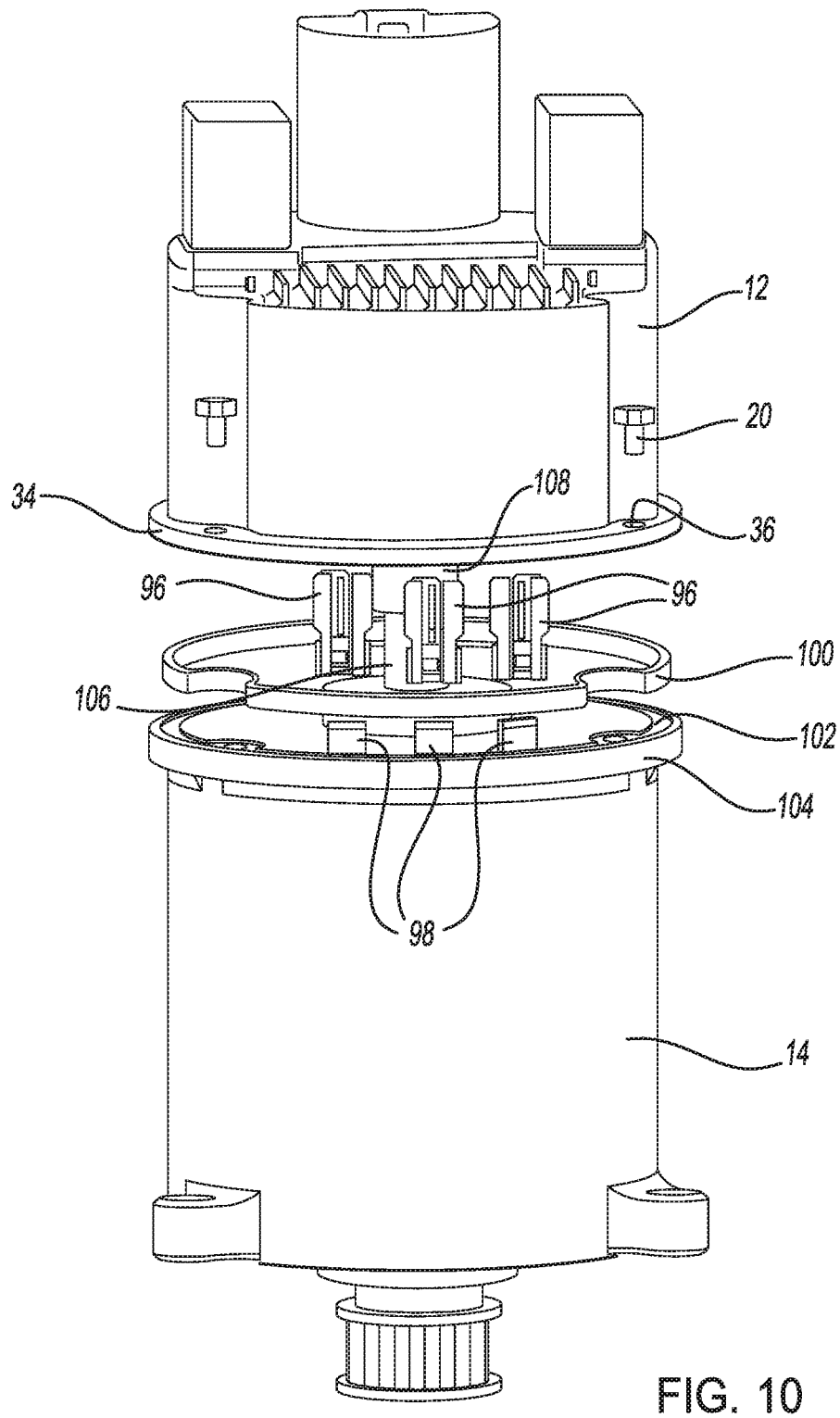
FIG. 10 is a front perspective assembly view of the motor electronics unit of FIG. 9 during assembly with an electrical motor.
Figure 11:
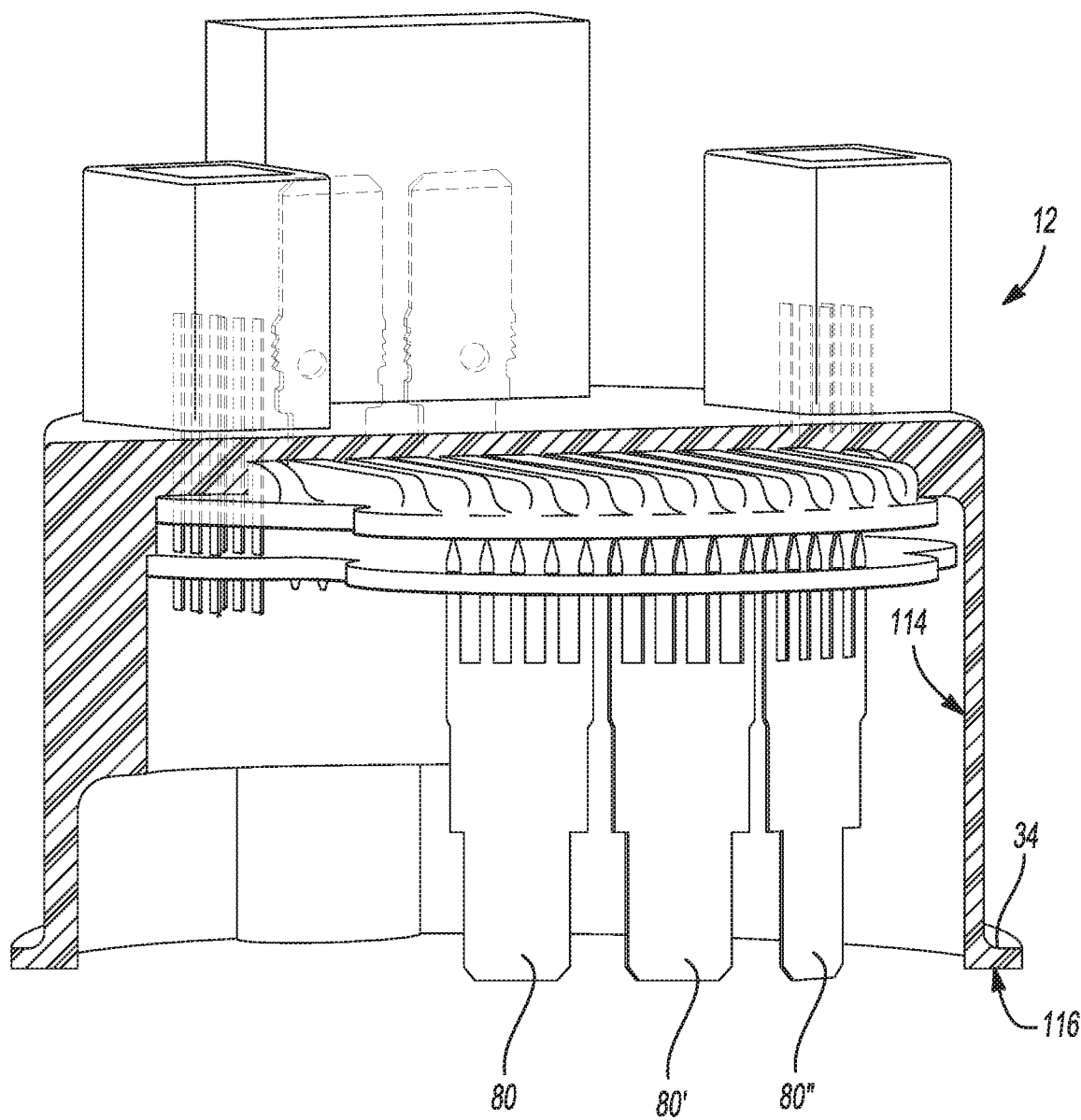
FIG. 11 is a front elevational cross sectional view taken at section 11 of FIG. 9.

Referring to FIG. 11 and again to FIG. 10, in the completed motor electronics unit 12, the electrical output conductors 80, 80', 80" extend from an inner surface 114 of the housing 32 and do not extend beyond a mating surface 116 of the mounting flange 34 where the mounting flange 34 is positioned between the housing 32 and the motor 14.

A motor electronics unit 12 of the present disclosure offers several advantages. These include protection of components of the populated printed circuit board from the environment, provision of a more efficient heat transfer path between heat producing components on the printed circuit board and the external environment, and elimination of a gap pad or heat transfer device required between the printed circuit board and the heat sink. In addition, the environmental seal located between a traditional housing and the electrical connectors is eliminated.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. A motor electronics unit, comprising:
   a printed circuit board having a first side and a second side;
   at least one electrical conductor connected to the printed circuit board;
   a heat sink positioned proximate to the printed circuit board with a gap disposed between the heat sink and the printed circuit board, the heat sink having an outer edge and raised ribs for dissipating heat;
   a housing molded from a low pressure injection molded thermally conductive polymeric material, the housing including:
      an endcap encapsulating the printed circuit board and covering the outer edge of the heat sink and disposed within the gap between the printed circuit board and the heat sink, wherein the endcap does not cover the raised ribs of the heat sink; and
      a first section of the at least one electrical conductor extending through and partially encapsulated by the endcap.

2. The motor electronics unit of claim 1, further including a connector body integrally connected to the housing, a second section of the at least one electrical conductor exposed within a cavity of the connector body and configured to electrically connect the printed circuit board to another component.

3. The motor electronics unit of claim 2, wherein the connector body extends outwardly from an end surface of the endcap.

4. The motor electronics unit of claim 2, wherein the connector body extends outward and away from the heat sink and in a direction perpendicular to the printed circuit board.

5. The motor electronics unit of claim 2, wherein the connector body defines a connector shroud encircling the second section of the at least one electrical conductor for attachment to an electrical connector.

6. The motor electronics unit of claim 1, wherein the at least one electrical conductor defines first and second input electrical power conductors functioning to supply power to the printed circuit board.

7. The motor electronics unit of claim 1, wherein the at least one electrical conductor defines multiple pins functioning to transmit communication signals.

8. The motor electronics unit of claim 1, further including a sensor positioned on the second side of the printed circuit board for sensing a position of a motor shaft.

9. The motor electronics unit of claim 8, wherein the sensor is a Hall Effect sensor having a portion of the sensor exposed, and not overmolded by the polymeric material of the housing or the endcap.

10. The motor electronics unit of claim 8, wherein the housing includes a recess for receiving a portion of a motor shaft, with the sensor positioned proximal to the recess.

11. The motor electronics unit of claim 1, wherein the first side of the printed circuit board contains multiple field effect transistors positioned in a predetermined area, each electrically connected to output conductors of a motor stator that extend from the housing, wherein the heat sink is positioned above the predetermined area.

12. The motor electronics unit of claim 1, wherein the at least one electrical conductor defines multiple output conductors extending away from the second side of the printed circuit board, wherein the output conductors are spaced from an inner surface of the housing and do not extend beyond a mating surface of a mounting flange of the housing adapted to mate the housing to a motor.

13. The motor electronics unit of claim 1, wherein the raised ribs of the heat sink are not covered by the polymeric material and extend through an opening in a top surface of the end cap and outward from the endcap.

* * * * *